(12) United States Patent
Teshima et al.

(10) Patent No.: US 9,209,329 B2
(45) Date of Patent: Dec. 8, 2015

(54) SILICON PHOTOELECTRIC MULTIPLIER WITH OPTICAL CROSS-TALK SUPPRESSION DUE TO PROPERTIES OF A SUBSTRATE

(71) Applicants: Max-Planck-Gesellschaft zur Forderung der Wissenschaften e.V., Munich (DE); Ljudmila Aseeva, Moscow (RU)

(72) Inventors: Masahiro Teshima, Unterschleissheim (DE); Razmik Mirzoyan, Unterschleissheim (DE); Boris Anatolievich Dolgoshein, Moscow (RU); Pavel Zhorzhevich Buzhan, Moscow Region (RU); Alexey Anatolievich Stifutkin, Moscow (RU)

(73) Assignee: MAX-PLANCK-GESELLSCHAFT ZUR FOERDERUNG DER WISSENSCHAFTEN E.V., Munich (DE)

( * ) Notice: Subject to any disclaimer, the term of this patent is extended or adjusted under 35 U.S.C. 154(b) by 0 days.

(21) Appl. No.: 13/923,687

(22) Filed: Jun. 21, 2013

(65) Prior Publication Data

US 2013/0277564 A1 Oct. 24, 2013

Related U.S. Application Data

(63) Continuation of application No. PCT/EP2010/007833, filed on Dec. 21, 2010.

(51) Int. Cl.
*G01T 1/20* (2006.01)
*H01L 31/0232* (2014.01)
(Continued)

(52) U.S. Cl.
CPC ........ *H01L 31/02327* (2013.01); *G01T 1/2006* (2013.01); *H01L 27/1446* (2013.01); *H01L 31/107* (2013.01); *H01L 31/186* (2013.01)

(58) Field of Classification Search
CPC ............ H01L 31/02327; H01L 31/186; G01T 1/2006; G01T 1/2018
USPC ....................................................... 250/366
See application file for complete search history.

(56) References Cited

U.S. PATENT DOCUMENTS 5,449,945 A * 9/1995 Brueck et al. ................. 257/451
7,620,330 B2 * 11/2009 Faska et al. ................... 398/202
(Continued)

FOREIGN PATENT DOCUMENTS

EP 1755171 B1 2/2007
JP S6173369 A 4/1986
(Continued)

OTHER PUBLICATIONS

Younger et al., "Crosstalk Analysis of Integrated Geiger-mode Avalanche Photodiode Focal Plane Arrays", Advanced Photon Counting Techniques III, edited by Mark A. Itzler, Joe C. Campbell, Proc. of SPIE vol. 7320, 73200Q • © 2009 SPIE • CCC code: 0277-786X/09/$18 • doi: 10.1117/12.819173 Proc. of SPIE vol. 7320 73200Q-1.*

(Continued)

*Primary Examiner* — Marcus Taningco
(74) *Attorney, Agent, or Firm* — Cooper Legal Group, LLC

(57) ABSTRACT

A cell for a silicon based photoelectric multiplier may comprise a substrate of a second conductivity type, a first layer of a first conductivity type, and/or a second layer of the second conductivity type formed on the first layer. The first layer and the second layer may form a first p-n junction, and the substrate may be configured such that in operation of the photoelectric multiplier from a quantity of light propagating towards a back side or side walls of the photoelectric multiplier, a negligible portion returns to a front side of the photoelectric multiplier.

5 Claims, 3 Drawing Sheets

(51) Int. Cl.
*H01L 27/144* (2006.01)
*H01L 31/107* (2006.01)
*H01L 31/18* (2006.01)

(56) References Cited

U.S. PATENT DOCUMENTS

| | | | |
|---|---|---|---|
| 7,667,400 B1* | 2/2010 | Goushcha | 313/532 |
| 8,679,959 B2* | 3/2014 | Carey et al. | 438/514 |
| 2008/0251692 A1* | 10/2008 | Teshima et al. | 250/207 |
| 2009/0065704 A1* | 3/2009 | Heringa et al. | 250/370.11 |
| 2010/0053594 A1 | 3/2010 | Yuan et al. | |
| 2010/0096555 A1* | 4/2010 | Nelson | 250/363.04 |

FOREIGN PATENT DOCUMENTS

| | | |
|---|---|---|
| JP | 2007536703 A | 12/2007 |
| JP | 2009535821 A | 10/2009 |
| JP | 2010283271 A | 12/2010 |

OTHER PUBLICATIONS

International Search Report cited in PCT Application No. PCT/EP2010/007833 dated Dec. 21, 2010, pp. 1-15.
Ivan Rech et al.: "Optical crosstalk in single photon avalanche diode arrays: a new complete model", Optics Express, vol. 16, No. 12, Jun. 9, 2008; pp. 8381-8394.
Richard D. Younger et al.: "Crosstalk analysis of integrated Geiger-mode avalanche photodiode focal plane arrays", Proceedings of SPIE, vol. 7320, Apr. 14, 2009, pp. 1-12.
Barton P. et al.: "Effect of SSPM surface coating on light collection efficiency and optical crosstalk for scintillation detection", Nuclear Instruments & Methods in Physics Research, Section A: Accelerators, Spectrometers, Detectors and Associated Equipment, Elsevier BV, vol. 610, No. 1, Oct. 21, 2009, pp. 393-396.

* cited by examiner

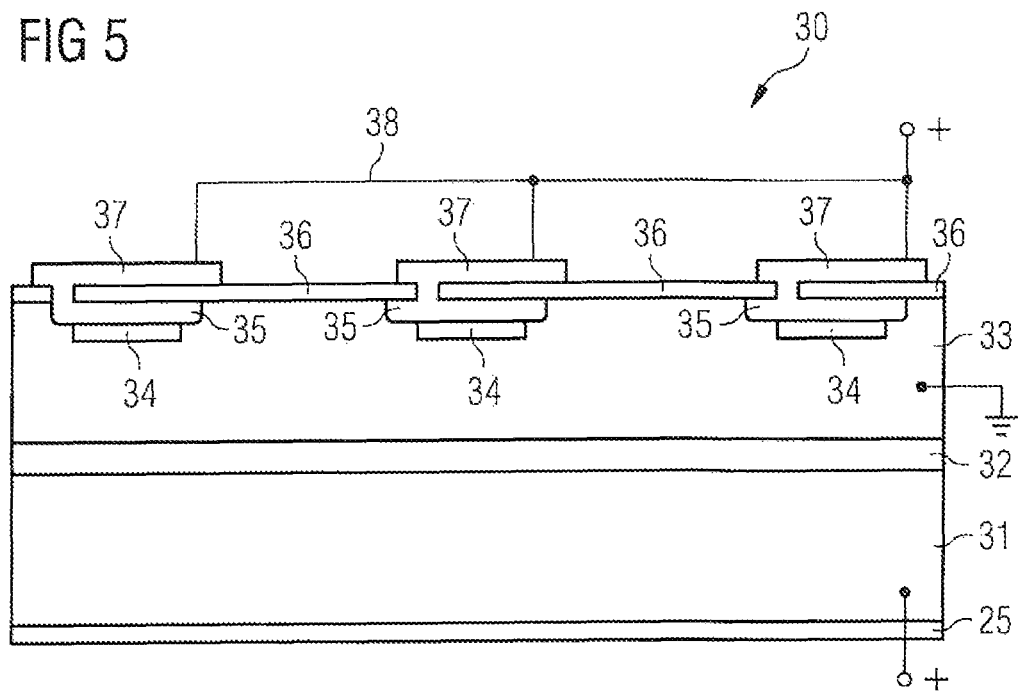
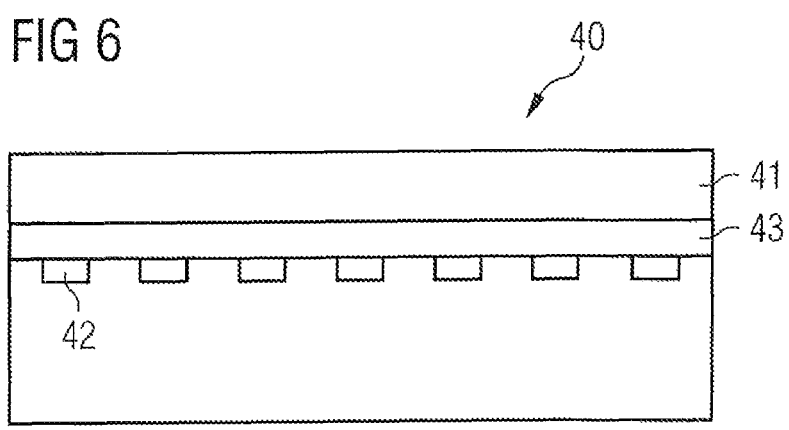

SILICON PHOTOELECTRIC MULTIPLIER WITH OPTICAL CROSS-TALK SUPPRESSION DUE TO PROPERTIES OF A SUBSTRATE

RELATED APPLICATION

This application corresponds to International Patent Application PCT/EP2010/007833, filed on Dec. 21, 2010, at least some of which may be incorporated herein.

SUMMARY

The disclosed subject matter is related to a cell for a silicon-based photoelectric multiplier, a silicon-based photoelectric multiplier, a radiation detector, and/or a method for fabricating a cell for a silicon-based photoelectric multiplier.

The disclosed subject matter relates to the field of semiconductor optoelectronic devices, particularly to photo-detectors with high efficiency of light detection, including the visible part of the spectrum. The photo-detectors can be used in a wide field of applications which employ the detection of very weak and fast optical signals including, for example, industrial and medical tomography, life science, nuclear physics, particle physics and astro-particle physics, etc.

A silicon-based photoelectric multiplier (SiPM) according to the state of the art (e.g., EP1755171B1) is composed of an array of individual cells. The SiPM comprises a silicon substrate and a plurality of cells which are located on a surface of said substrate, for example, in an epitaxial layer. Each cell comprises an internal individual quenching resistor made of, for example, high resistant polysilicon and located on top of a silicon oxide layer which covers all cells. In operation each cell is supplied with reverse bias that exceeds the break-down voltage. When a photon is absorbed in the cell, a Geiger discharge takes place, the discharge being limited by the quenching resistor.

One problem of these devices can be described as "optical cross-talk" wherein different forms of optical cross-talk can appear in the devices. One form of optical cross-talk originates from photons created in a Geiger discharge of a neighboring cell. Another form of optical cross-talk, which is addressed by the disclosed subject matter, originates from photons produced in a multiplier at an inclined angle at a first cell, being totally internally reflected at the back surface or side surface of the device and impinging into another cell from the back side or side wall and initiating a Geiger discharge in the another cell. Such a situation is depicted in FIG. 1 in which a schematic cross-sectional representation of a silicon photoelectric multiplier is shown. Because the total internal reflection efficiency is 100%, the back reflected photon can survive several reflections from one or more walls of the SiPM before being absorbed by one of the cells and firing the one of the cells.

FIG. 1 shows a silicon photoelectric multiplier comprising an array of individual cells 1 located next to each other at a front entrance surface of the device. A light beam produced in the device at a cell at the outward left position under an angle Θ will be totally internally reflected at the back surface of the device so that it impinges into another cell at the outward right position of the array shown. The critical angle for the total internal reflection in silicon can be calculated to $\Theta_{tot}$=arcsin 1/3.5=16.6° for light in the red spectral region. The photons can thus propagate to another (e.g., not primarily fired) pixel and initiate a discharge at the another pixel. For larger size photo-multipliers, the angular range where the total internal reflection happens may be larger (e.g., than the angular range where the total internal reflection happens for smaller size photo-multipliers). In an embodiment where the incident light hits the back side surface of the photo-multiplier at an angle <16.6°, (e.g., merely) ~70% of the light may leave the sample and 30% of the light may be reflected back.

Accordingly, what is provided herein, among other things, is a cell for a silicon-based photoelectric multiplier, a method for fabricating a cell for a silicon-based photoelectric multiplier, and a silicon-based photoelectric multiplier composed of a plurality of cells in which optical cross-talk between the cells, due to total internal reflection and/or partial back-reflection, may be significantly reduced without significantly reducing the optical detection efficiency.

The disclosed subject matter is believed to provide for the prevention or reduction of total internal reflection and/or partial reflection of light within the silicon-based photoelectric multiplier by configuring a substrate in a way so that light having entered the device at the front surface and having penetrated the device in a direction to the back surface or side wall will not return to the front surface in a considerable amount. The result is that (e.g., merely) a small amount of incident light returns to the front surface and optical cross-talk is thus reduced to a tolerable and/or desired level.

The disclosed subject matter is directed to a cell for a silicon-based photoelectric multiplier which comprises a substrate of a second conductivity type, a first layer of a first conductivity type, a second layer of a second conductivity type formed on the first layer, wherein the first layer and the second layer form a first p-n junction, wherein the substrate is configured such that in operation of the photoelectric multiplier from a quantity of light propagating towards a back side or side wall of the multiplier a negligible portion returns to a front side of the multiplier, which means that less than 50%, and/or (e.g., preferably) less than 25%, may return to the front side.

According to an embodiment, a material layer is applied onto the back surface of the substrate, wherein the material type of the material layer is chosen such that the reflectivity of light with a wavelength ≈1000 nm incident on the interface between the substrate and the material layer is (e.g., substantially) below 100%, smaller than 50% and/or smaller than 25%.

In an embodiment, the material of the material layer can be one or more of a metal, a metal compound, a metal alloy, and/or a semiconductor of a pure and/or composite type. The material layer can be formed from one (e.g., and merely one) of an element metal. However, it is also possible to form an alloy of two or more metals and/or of one metal and another element to form the material of the material layer. Besides metals, semiconductor materials can also be used as the material of the material layer. It is also possible to use an alloy semiconductor as material for the material layer.

According to an embodiment, the material layer can be deposited onto the back side surface of the substrate by an evaporation technique or by sputtering or any other conventional technique. The thickness of the material layer can be in the range of 5 nm to 1000 nm, 5 nm to 500 nm, and/or 5 nm to 100 nm.

According to an embodiment, the back surface of the substrate is processed by ion implantation wherein the parameters of the ion implantation are selected such that, due to an implantation-induced damage of the crystal lattice, an absorption length of light with a wavelength in a range of ≈1000 nm is decreased so that light incident on the front side will not be transmitted to the back side of the device. According to an embodiment, the back surface of the substrate is processed by ion implantation comprising an ion dose in the range of $10^{13}$ to $10^{15}$ cm$^{-2}$ and/or an ion energy in the range of 1 MeV to 10 MeV.

According to an embodiment, the side surfaces of the multiplier and/or the substrate are treated in the same way as the back side surface of the substrate.

According to an embodiment, the doping concentration of the substrate lies in a range of $10^{19}$ to $10^{20}$ cm$^{-3}$ of the second conductivity type. Due to free carrier absorption of the doping material, an absorption length of light with a wavelength in a range of ≈1000 nm is significantly decreased so that light incident on the front side will not be transmitted to the back side of the device. The above-mentioned first and second layers can be then grown epitaxially.

According to an embodiment, the back surface of the substrate comprises a structure fabricated so as to trap or to diffuse light incident on the back surface from inside the substrate. The structure can, for example, comprise a plurality of indentations, grooves or recesses so that light beams are deflected or diffused and (e.g., merely) a small to zero amount of incident light is reflected back to the front surface of the device.

According to an embodiment, the cell further comprises a doped buried layer of the first conductivity type, wherein the substrate and the buried layer form a second p-n conjunction. In the case that the surface treatment is done by an ion implantation, the doped buried layer could be fabricated at the same time by the same ion implantation.

The disclosed subject matter also relates to a silicon-based photoelectric multiplier comprising a plurality of cells such as those described before, wherein the cells are all fabricated on one common substrate.

The disclosed subject matter also relates to a radiation detector comprising a scintillator and an array of silicon-based photoelectric multipliers such as those as described in the preceding paragraph, wherein the silicon-based photoelectric multipliers are arranged to receive bursts of light produced by the scintillator in response to received radiation.

The disclosed subject matter is also directed to a method for fabricating a cell for a silicon-based photoelectric multiplier, comprising providing a substrate of a second conductivity type, providing a first layer of a first conductivity type and a second layer of a second conductivity type, wherein the first layer and the second layer form a first p-n junction, and configuring the substrate such that in operation of the photoelectric multiplier from a quantity of light propagating towards a back side of the multiplier a negligible portion returns to a front side of the multiplier.

According to an embodiment, the method comprises applying a material layer onto the back surface of the substrate, wherein the material of the material layer is chosen such that the reflectivity of light with a wavelength in a ≈1000 nm incident on the interface between the substrate and the material layer is (e.g., substantially) below 100%, smaller than 50% and/or smaller than 25%.

According to an embodiment, the material layer is deposited by (e.g., one of) evaporation, sputtering and/or chemical vapor deposition. An advantage is that the application of the material layer can be performed in an early stage, in a wafer level stage when several multiplier devices may still be joined together before the devices are packaged and the wafer is singulated into single packaged multiplier devices.

According to an embodiment, the material of the material layer comprises one or more of a metal, a metal compound, a metal alloy, or a semiconductor.

According to an embodiment, the method comprises processing the back surface of the substrate by ion implantation wherein the parameters of the ion implantation are selected such that, due to an implantation-induced damage of the crystal lattice, an absorption length of light with a wavelength in a range of ≈1000 nm is decreased. According to an embodiment thereof, the ion implantation comprises an ion dose in the range of $10^{13}$ to $10^{15}$ cm$^{-2}$ and/or an ion energy in the range of 1 MeV to 10 MeV.

According to an embodiment, the silicon substrate is provided with a doping concentration in a range of $10^{19}$ to $10^{20}$ cm$^{-3}$ of a second conductivity type. Afterwards, a silicon layer is grown epitaxially on the upper surface of the substrate and/or the photoelectric multiplier is fabricated within the epitaxial layer. The epitaxial growth can start with growing the first layer of a first conductivity type on the highly doped silicon substrate of the second conductivity type. Afterwards, the second layer, the quenching resistor layer, the voltage distribution lines and/or the buried layer can be fabricated by ion implantation.

According to an embodiment, the method for fabricating starts with providing a substrate of second conductivity type having a low and/or medium doping level of, for example, $5 \times 10^{14}$-$5 \times 10^{16}$ cm$^{-3}$, then gluing the back surface of the low doped substrate to another substrate having special absorbing characteristics, such as, for example, a highly doped substrate of second conductivity type having a doping range of, for example, $10^{19}$ to $10^{20}$ cm$^{-3}$, and then fabricating the second layer, the quenching resistor layer, the voltage distribution lines and/or the buried layer on the low doped substrate.

According to an embodiment, the method comprises fabricating a structure into the back surface of the substrate so as to trap and/or to diffuse light incident from inside the substrate.

According to an embodiment, the method comprises generating a doped buried layer of the first conductivity type, so that the substrate and the doped buried layer form a second p-n junction.

According to an embodiment, the side surfaces of the substrate are treated in a (e.g., substantially) same and/or similar way as the back side surface of the substrate.

DESCRIPTION OF THE DRAWINGS

Exemplary embodiments of the disclosure are explained in greater detail below with reference to the drawings, in which:

FIG. 5 illustrates a side view representation of a cell of a silicon-based photoelectric multiplier.

FIG. 6 illustrates a cross-sectional representation of a radiation detector.

DETAILED DESCRIPTION

Figure 1:
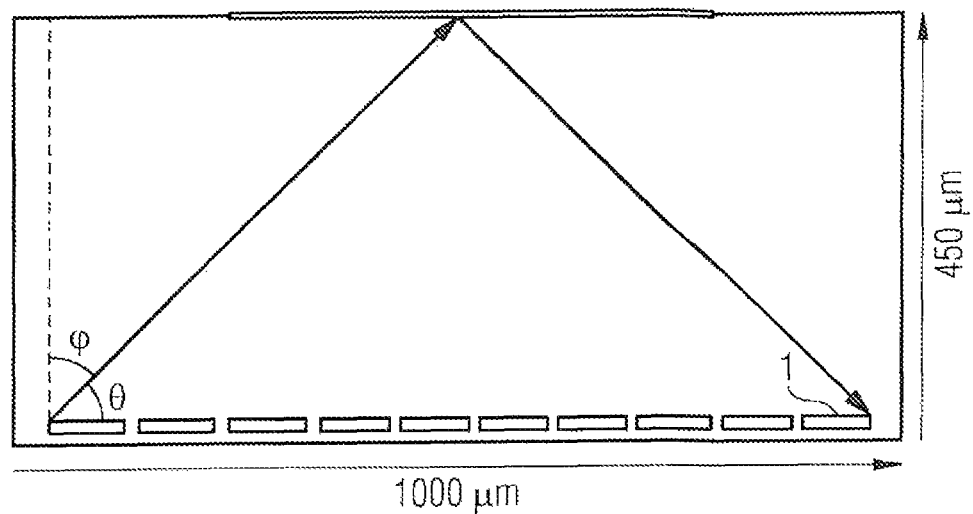
FIG. 1 illustrates a schematic cross-sectional representation of a conventional silicon-based photoelectric multiplier illustrating the problem of total internal reflection.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. The following description is therefore not to be taken in a limiting sense, and the scope is defined by the appended claims. It should also be noted that the representations of the various layers, sheets or substrates in the Figures are not necessarily to scale.

In the following detailed description, reference is made to the accompanying drawings, which form a part thereof, and in which is shown by way of illustration specific embodiments in which the disclosed subject matter may be practiced. In this regard, directional terminology, such as "upper", "lower", "left-hand", "right-hand", "front side", "back side", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the disclosed subject matter.

Figure 2A:
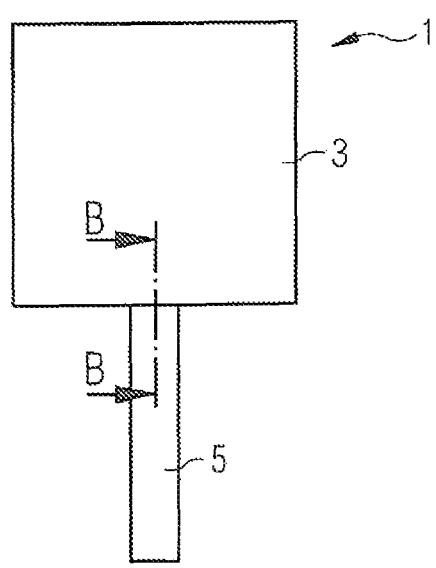
FIG. 2A illustrates a top view representation of a cell of a silicon-based photoelectric multiplier.
Figure 2B:
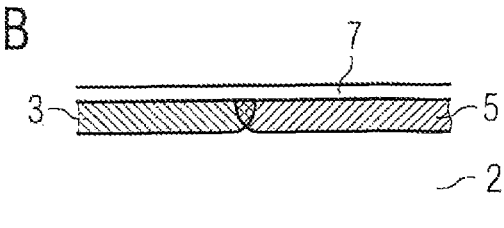
FIG. 2B illustrates a cross-sectional representation of a cell of a silicon-based photoelectric multiplier.

FIG. 2A shows a top view representation of a cell of a silicon-based photoelectric multiplier according to a first embodiment and FIG. 2B shows a cross-sectional representation of the cell along line B-B of FIG. 2A, wherein (e.g., merely) a section down to a first layer 2 is shown.

The cell 1 comprises a first layer 2 of a first conductivity type and a second layer 3 of a second conductivity type formed on the first layer 2 so that the first layer 2 and the second layer 3 form a first p-n junction. The cell 1 further comprises a quenching resistor layer 5 formed on the first layer 2 laterally besides the second layer 3 and connected to a lateral side face of the second layer 3.

The cell 1, and/or the second layer 3, can have a rectangular or quadratic shape and the quenching resistor layer 5 can be connected to one of the side edges of the second layer 3 and/or in the center of the side edge. The quenching resistor layer 5 extends in a direction away from the second layer 3 to make electrical contact to a voltage distribution line (not shown) remote from the second layer 3. The cell 1 can also comprise an insulation layer 7 covering the first layer 2, the second layer 3 and the quenching resistor layer 5. The insulation layer 7 can cover the whole matrix of cells with (e.g., merely) one opening at an edge portion of the device for the purpose of electrically contacting the voltage distribution line. The second layer 3 and the quenching resistor layer 5 can be formed as well areas into the first layer 2 by using, for example, ion implantation processes. As can be seen in FIG. 2B, the implantation region of the second layer 3 is shown left-hatched and the implantation region of the quenching resistor layer 5 is shown right-hatched and an overlap between both regions can be provided when conducting the implantations so as to provide for a satisfactory electrical contact between both regions.

It is to be noted that the elements as shown in FIG. 2A are not necessarily to scale as regards their dimensions with respect to each other as well as the geometric dimensions of the elements themselves. For example, the quenching resistor layer 5 is shown to have a strip-like shape wherein the strip-like quenching resistor layer 5 can have, for example, a length to width ratio of greater than 10, greater than 20, and/or greater than 30. Moreover, the ratio of the length of a side edge of the cell 1 or of the second layer 3 to the width of the strip-like quenching resistor layer 5 can be, for example, greater than 10, greater than 20, and/or greater than 30.

Furthermore, the quenching resistor layer 5 can have a resistivity in the range of 10 to 50 KOhm/square. With such a resistivity, the quenching resistor layer 5 can (e.g., efficiently) act as a quenching resistor for quenching the avalanche current in operation of the photodiode. The value of the resistivity can be adjusted by the geometric dimensions and the dopant concentration of the quenching resistor layer 5.

The second layer 3 can have a (e.g., relatively) high level dopant concentration which can, for example, be in the range of $10^{18}$ to $10^{19}$ cm$^{-3}$.

Figure 3:
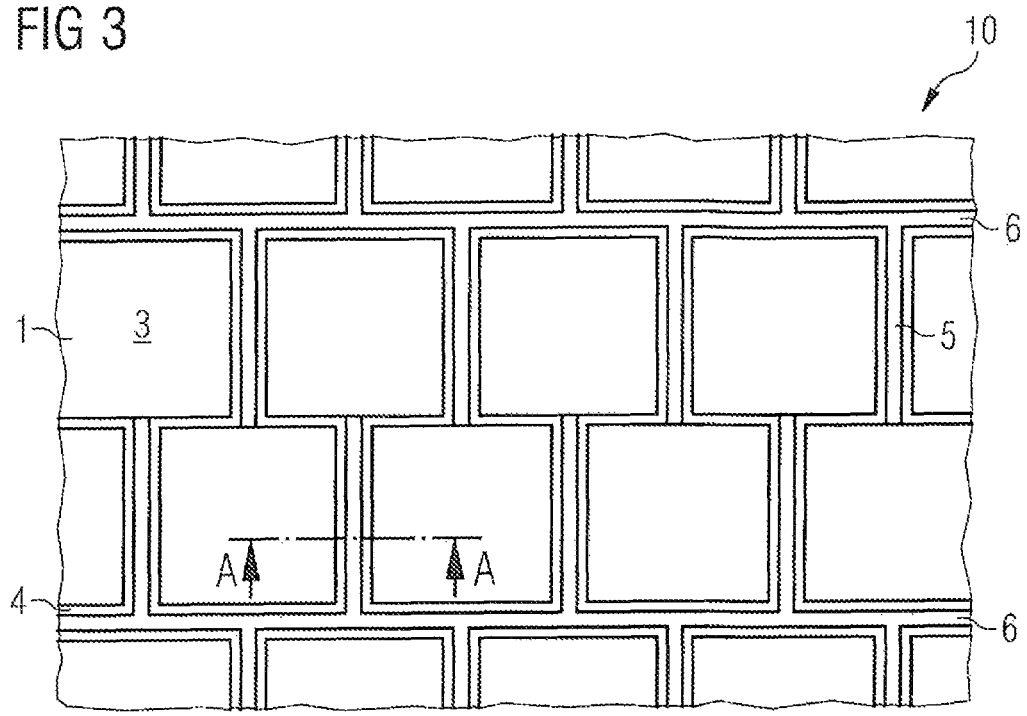
FIG. 3 illustrates a top view representation of a section of a silicon-based photoelectric multiplier.

FIG. 3 shows a top view representation of a section of a silicon-based photoelectric multiplier according to an embodiment.

The photoelectric multiplier 10 depicted in FIG. 3 is comprised of a plurality of cells 1 such as that shown in FIG. 2A and/or FIG. 2B. They are arranged along rows wherein the cells 1 of one row are laterally displaced with respect to the cells 1 of an adjacent row wherein the displacement can be, for example, half the length of one side edge of a quadratically shaped cell 1.

The photoelectric multiplier 10 can have a plurality of voltage distribution lines 6. In the section of the photoelectric multiplier 10, as shown in FIG. 3, there may be two voltage distribution lines 6 which are arranged along outer side edges of two adjacent rows of cells 1. The quenching resistor layers 5 of each cell 1 of one row extend in the narrow space between two neighboring cells 1 of an adjacent row and are electrically connected with the voltage distribution line 6 extending along the adjacent row. The voltage distribution lines 6 can (e.g., also) be made of a well area formed within the first layer 2. The voltage distribution lines 6 can be formed of well areas having a dopant concentration of about $10^{19}$ cm$^{-3}$ or $5\times10^{18}$ cm$^{-3}$ to $5\times10^{19}$ cm$^{-3}$ or more so that they function as conductive wires. Thus, the fabrication of the voltage distribution lines 6 can also be part of and/or embedded within a CMOS fabrication process.

Figure 4:
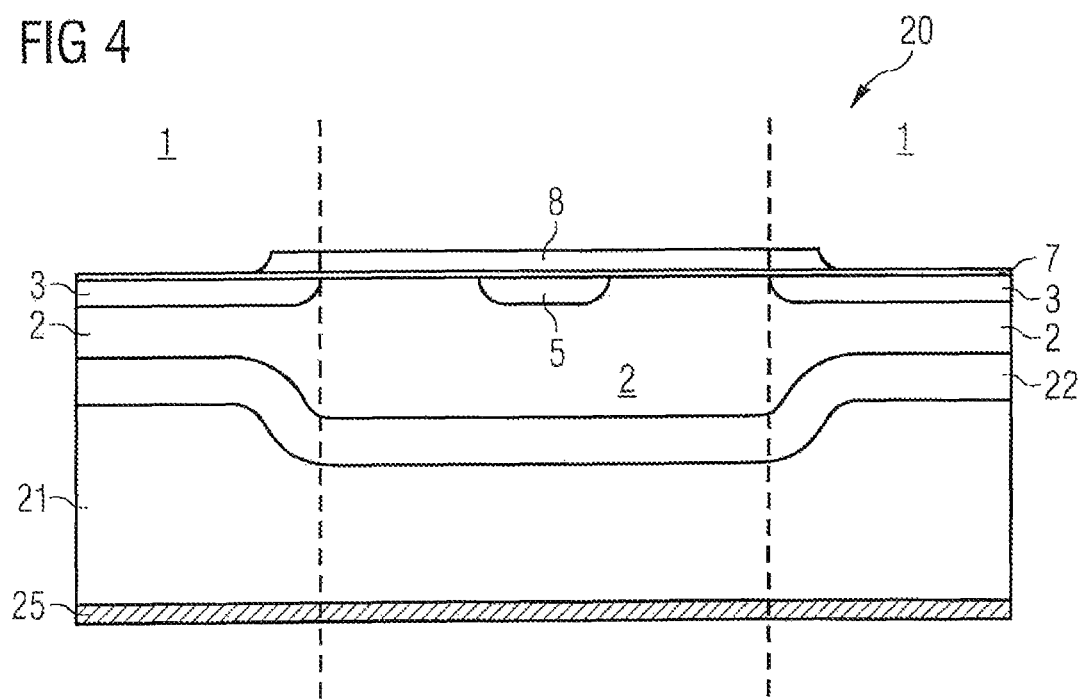
FIG. 4 illustrates a cross-sectional representation along line A-A of FIG. 3 of the silicon-based photoelectric multiplier.

FIG. 4 shows a cross-sectional representation along line A-A of FIG. 3 of the silicon-based photoelectric multiplier according to an embodiment.

The section of the photoelectric multiplier 20 shown in FIG. 4 includes the right part of one cell 1 shown on the left side of the drawing and the left part of a further cell 1 shown on the right side of the drawing and a region in between the adjacent cells 1, the region comprising a quenching resistor layer 5. The photoelectric multiplier 20 comprises a substrate 21 of a second conductivity type having a doping agent concentration in the range of $5\times10^{14}$-$5\times10^{16}$ cm$^{-3}$ and a buried layer 22 of a first conductivity type having, for example, a peak doping agent concentration in the range of $5\times10^{17}$-$5\times10^{18}$ cm$^{-3}$. The buried layer 22 is generated by an ion implantation.

Above the buried layer 22, the plurality of identical cells 1 is located, wherein each cell 1 is formed by the first layer 2 and the second layer 3. The first layer 2 is common for all cells 1 and it is contiguous throughout the photoelectric multiplier 20. The second layer 3 is formed as a thin layer of second conductivity type having a relatively high doping agent concentration such as, for example, $10^{18}$ to $10^{19}$ cm$^{-3}$, and disposed on top of the first layer 2. The second layer 3 functions as an entrance window of the photoelectric multiplier 20. The first layer 2 and the second layer 3 form a first N-P junction at an interface between them, wherein in operation, a reverse bias voltage is applied to the first N-P junction to such an extent, for example, that the photodiode operates in a Geiger mode. The thin strip-like silicon quenching resistor layers 5 of second conductance type connect each cell 1 with one of the voltage distribution lines 6 and serve as quenching resistors having a resistance of 10-50 KOhm/square. The voltage distribution lines 6 are made of second conductivity type silicon layers having a (e.g., relatively) high doping agent concentration such as, for example, about $10^{19}$ cm$^{-3}$ or $5 \times 10^{18}$ cm$^{-3}$ to $5 \times 10^{19}$ cm$^{-3}$ or more of a doping agent concentration. The upper surface of the photoelectric multiplier 20 is covered by an insulation layer 7, such as a silicon oxide layer, with corresponding antireflection properties at an upper surface thereof. The strip-like quenching resistor layers 5 and voltage distribution lines 6 are disposed between the first layer 2 and the insulation layer 7. The voltage distribution lines 6 are connected together on the periphery of the photoelectric multiplier and there is (e.g., merely) a single input power supply contact through (e.g., merely) a single opening window in the insulation layer 7. A grid-like aluminum layer 8 which is serving for the output of the SiPM signal is disposed on top of the silicon oxide layer 7.

The cell 1 also comprises, on the back surface of the substrate 21, a material layer 25, the material of which can be one of those mentioned above. If, for example, chromium is used as the material of the material layer 25, a reflectivity of R=21.38% can be calculated for a light beam having a wavelength of 1000 nm at the interface between the substrate 21 and the material layer 25.

The photoelectric multiplier 20 according to FIG. 4 is an embodiment of a highly efficient CMOS-technology compatible photoelectric multiplier. The buried layer 22 can be formed by ion implantation which can be carried out at an appropriate time in the course of the CMOS fabrication process. Also, the other layers like the second layer 3, the quenching resistor layers 5 and/or the voltage distribution lines 6 can be processed by further ion implantations at appropriate times in the course of a CMOS fabrication process.

The silicon based photoelectric multiplier 20 thus contains the substrate 21 of the second conductivity type, the material layer 25, the buried layer 22 of the first conductivity type, a first layer 2 of first conductivity type, a second layer 3 of the second conductivity type (entrance window), strip-like quenching resistor layers 5 (quenching resistors) of a first conductivity type, voltage distribution buses 6, the insulation layer 7, and the grid-like layer 8 on top of the insulation layer 7. As an example, the substrate 21 can have p-type (n-type) conductivity, the buried layer 22 can have n-type (p-type) conductivity, the layer 2 can have n-type (p-type) conductivity, the layers 3 can have p-type (n-type) conductivity, and the quenching resistor layers 5 and the voltage distribution lines 6 can have p-type (n-type) conductivity.

It should further be noted that, according to the embodiment of FIG. 4, the buried layer 22 is fabricated as a non-planar layer, and may be fabricated such that it comprises varying depth throughout the device. In FIG. 4, in areas between the cells 1, the buried layer 22 may be located deeper within the substrate as compared to the areas of the cells 1. One reason for this may be that the electric field will be higher within the cells 1 as compared to the areas between the cells 1 so that (e.g., merely) light which is incident on the cell 1 will be efficiently detected (e.g., merely) by cell 1.

The highly efficient light detection in a broad part of the spectrum along with high uniformity of an electrical field may be reached in a structure such as that shown in FIG. 4, which is made by a CMOS-technology process. A high electric field needed for Geiger-type discharge (e.g., voltage above the breakdown value) is created in the N-P junction between the second layer 3 (e.g., entrance window) and the first layer 2.

In an embodiment, another N-P junction is made between the substrate 21 and the buried layer 22, where the junction prevents penetration of photoelectrons, created by secondary photons of the Geiger discharge, into the volume of adjacent cells. It should be noted, however, that the buried layer 22 can also be omitted, if there is no need for an N-P junction for preventing penetration of photoelectrons from neighboring cells.

According to an embodiment, instead of the material layer 25 a back side ion implantation can be employed with one or more parameters (e.g., as described above).

According to an embodiment, instead of the material layer 25, the substrate 21 can be provided with a high doping level in the range of $10^{19}$ to $10^{20}$ cm$^{-3}$ of the second conductivity type.

Highly Efficient CMOS-technology compatible photoelectric multipliers, according to at least one embodiment, comprise independent cells typically having 20-100 microns of size, that is, for example, a length of one side edge of one cell 1 or second layer 3. At least some of the cells are jointed through quenching resistors 5 with voltage distribution buses 6, and the identical bias voltage, exceeding the breakdown voltage, is applied to the cells 1, that provides working in the Geiger mode. The quenched Geiger discharge develops in the active region of the cell when a photon gets there. The quenching, which inhibits the discharge, takes place due to fluctuations of the number of the charge carriers up to zero when the voltage of the p-n boundary drops, due to availability of quenching resistor 5 (current-limiting resistor) in each cell. The current signals from the fired cells are summed up on a common load. The amplification of each cell constitutes up to $10^7$. The spread of amplification value is defined by technological spread of the cell capacity and breakdown voltage of the cell, and constitutes less than 5%. As the cells may be identical, the response of the detector to low intensity light flashes is proportional to the number of the worked cells, i.e. to light intensity.

FIG. 5 shows a side view representation of a silicon-based photoelectric multiplier according to an embodiment. The silicon-based photoelectric multiplier 30 may not be fabricated by a CMOS fabrication process. Instead, the fabrication process may start from a light and/or medium n-doped silicon substrate 31 on the upper surface of which a heavily doped p++ layer 32 ($5 \times 10^{17}$ cm$^{-3}$ to $5 \times 10^{18}$ cm$^{-3}$, for example) is generated by, for example, diffusion doping. Thereafter, a light or medium doped p− layer 33 is epitaxially grown onto the layer 32. Within the epitaxially grown layer 33, a first p− doped layer 34 and/or a second n+ layer 35 are embedded so that they form a first n-p junction in the vicinity of the surface of the cell. Thereafter, on top of the layer stack, an insulation layer 36 is deposited which can be fabricated of a silicon oxide layer. A through-hole is formed in the insulation layer 36 at one end so that later the second layer 35 can be electrically contacted. Thereafter, a resistor layer 37 is deposited on the insulating layer 36 wherein the resistor layer 37 can be fabricated of undoped or lightly doped polysilicon. The resistor layer 37 acts as a quenching resistor to quench the Geiger discharge. Thereafter, the resistor layers 37 of the cells are connected together and with a voltage distribution line 38. At any desired and/or appropriate stage within the above process, a material layer 25 can be deposited onto the back surface of the substrate 31 or a back side ion implantation can be employed. Further embodiments of the multiplier of FIG. 5 can be formed along the embodiments described above. For example, the layer 32 can be omitted and the substrate can be provided with a relatively high second conductivity type doping level of, for example, $5 \times 10^{17}$ cm$^{-3}$ to $5 \times 10^{18}$ cm$^{-3}$. Alternatively and/or additionally, the material layer 25 can be omitted and instead, a highly doped substrate, a heavily implanted substrate and/or a structured substrate back surface can be provided.

FIG. 6 shows a cross-sectional representation of a radiation detector according to an embodiment. The radiation detector 40 includes a scintillator 41 that produces a scintillation or burst of light when a gamma-ray strikes the scintillator 41. The burst of light is received by an array of silicon-based photoelectric multipliers 42 as described above monolithically disposed a silicon substrate 43. The material of the scintillator 41 can be one of LSO, LYSO, MLS, LGSO, LaBr and mixtures thereof. Other scintillator materials can alternatively and/or additionally be used. The scintillator 41 can be composed of a single crystal or an array of crystals. In addition, an optional planar light pipe 44 can be interposed between the scintillator 41 and the multipliers 42 to improve the transmission of photons of the light bursts to the multipliers 42.

A plurality of radiation detectors 40, as shown in FIG. 6, can be arranged within a positron emission tomography (PET) imaging system.

What is claimed is:

1. A method for fabricating a silicon-based photoelectric multiplier, comprising:
   providing a substrate of a second conductivity, the substrate comprising a front surface and a back surface;
   fabricating a plurality of cells on the front surface of the substrate, each of the plurality of cells comprising:
   a first layer of a first conductivity; and
   a second layer of the second conductivity formed on the first layer, the first and the second layer forming a first p-n junction; and
   processing the back surface of the substrate by ion implantation comprising an ion dose in a range of $10^{13}$ cm$^{-2}$ to $10^{15}$ cm$^{-2}$ and an ion energy in a range of 1 MeV to 10 MeV.

2. The method of claim 1, comprising:
   applying a material layer onto the back surface of the substrate, a material of the material layer chosen such that a reflectivity of light with a wavelength of about 1000 nm incident on an interface between the substrate and the material layer is less than 25%.

3. The method of claim 2, the material of the material layer comprising one or more of a metal, a metal compound, a metal alloy, or a semiconductor.

4. The method of claim 1, the substrate provided with a doping concentration in a range of $10^{19}$ cm$^{-3}$ to $10^{20}$ cm$^{-3}$.

5. The method of claim 1, comprising fabricating a structure into the back surface of the substrate so as to at least one of trap or to diffuse light incident from inside the substrate.

* * * * *